United States Patent
Kojo

(10) Patent No.: US 7,642,699 B2
(45) Date of Patent: Jan. 5, 2010

(54) ELECTRONIC-COMPONENT CONTAINER AND PIEZOELECTRIC RESONATOR DEVICE

(75) Inventor: Takuya Kojo, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 400 days.

(21) Appl. No.: 11/659,828

(22) PCT Filed: Jan. 26, 2006

(86) PCT No.: PCT/JP2006/001237

§ 371 (c)(1), (2), (4) Date: Feb. 9, 2007

(87) PCT Pub. No.: WO2006/095503

PCT Pub. Date: Sep. 14, 2006

(65) Prior Publication Data

US 2007/0251860 A1    Nov. 1, 2007

(30) Foreign Application Priority Data

Mar. 11, 2005    (JP) ............................. 2005-069690

(51) Int. Cl.
H01L 41/08    (2006.01)
(52) U.S. Cl. ...................................................... 310/344
(58) Field of Classification Search ................. 310/344, 310/348
See application file for complete search history.

(56) References Cited

U.S. PATENT DOCUMENTS

| | | | | |
|---|---|---|---|---|
| 5,841,217 A * | 11/1998 | Kizaki et al. | ................ | 310/348 |
| 6,531,806 B1 * | 3/2003 | Daidai | ........................ | 310/344 |
| 6,703,768 B2 * | 3/2004 | Kageyama et al. | .......... | 310/344 |
| 7,427,822 B2 * | 9/2008 | Kusai | ......................... | 310/344 |

FOREIGN PATENT DOCUMENTS

| | | |
|---|---|---|
| JP | 2002-231836 | 8/2002 |
| JP | 2003-168949 | 6/2003 |
| JP | 2004-289238 | 10/2004 |

* cited by examiner

*Primary Examiner*—Mark Budd
(74) *Attorney, Agent, or Firm*—Marvin A. Motsenbocker; Mots Law, PLLC

(57) ABSTRACT

An electronic-component container is provided in which a metal lid is bonded with an insulating package. The container comprises the insulating package having a housing portion for housing an electronic component element having an electrical function, a metallized sealing portion formed around the housing portion and hermetically bonded with the metal lid, and a castellation having a terminal electrode formed at a side end portion thereof, and the metal lid formed in a shape as viewed from the top which is substantially equal to a shape as viewed from the top of the insulating package, wherein a brazing material is formed on a lower surface of the metal lid, and the brazing material is provided with a welding portion which is bonded with the metallized sealing portion inside the castellation when the metal lid is bonded with the insulating package.

7 Claims, 8 Drawing Sheets

(a)

(b)

(a)

(b)

(a)

(b)

ELECTRONIC-COMPONENT CONTAINER AND PIEZOELECTRIC RESONATOR DEVICE

TECHNICAL FIELD

The present invention relates to an electronic-component container and a piezoelectric resonator device. More particularly, the present invention relates to an electronic-component container and a piezoelectric resonator device which house an electronic component element having an electrical function on an insulating package, and have improved reliability in hermetically enclosing the electronic component element with the insulating package and a metal lid.

BACKGROUND ART

Examples of an electronic component which requires hermetic enclosure include piezoelectric resonator devices, such as a crystal vibrator, a crystal filter, a crystal oscillator, and the like. In all of these piezoelectric resonator devices, a metal thin-film electrode is formed on a surface of a crystal resonator plate, and the crystal resonator plate is hermetically sealed to protect the metal thin-film electrode from the outside air. In these piezoelectric resonator devices, generally, due to requirement for surface mounting of components, a piezoelectric element (crystal resonator plate) is housed in a ceramic package (insulating package) and is covered with a metal lid on which a brazing material is formed, and the ceramic package and the metal lid are welded together to hermetically seal the piezoelectric vibrating element. As described in Patent Document 1, as there is a trend toward low-height and low-cost electronic-component containers, a type of electronic-component container in which the brazing material of the metal lid is directly welded to a metallized sealing portion formed on the ceramic package without via a metal sealing ring on the ceramic package (so-called direct seam sealing type, beam sealing type, etc.) is currently increasingly used.

Patent Document 1: JP 2003-168949 A

DISCLOSURE OF INVENTION

Problem to be Solved by the Invention

In the electronic-component container of this type in which the brazing material of the metal lid is directly welded to the metallized sealing portion formed on the ceramic package, an outer circumferential shape of the metallized sealing portion is likely to vary, depending on an outer circumferential shape of the ceramic package, resulting in an unstable welding region. Particularly, a castellation for leading an electrode to an external terminal is generally formed at a side end portion (outer circumferential portion) of the ceramic package. With such a structure, however, as the size of the electronic-component container is reduced, the castellation and the metallized sealing portion are disposed closer to each other, so that it is currently difficult to secure a sealing region. A melt region of the metal lid with respect to the metallized sealing portion overlaps a region in which the castellation is formed, so that the melt region becomes considerably narrow at this portion, resulting in leakage leading to a failure of hermetic sealing, which is a serious problem. Against this, conventionally, in the seam sealing structure, a method of increasing the melt region of the brazing material by increasing power supplied to a seam roller and increasing a melting temperature, has been used. However, in the case of the method of increasing the melting temperature, the following problems may newly arise: the melted brazing material may be scattered or the like in the housing (splash problem), or the package may be broken due to melt heat distortion; and the like. Therefore, at present, there are not more preferable measures taken against these problems.

In view of these problems, the present invention is achieved. An object of the present invention is to provide an electronic-component container and a piezoelectric resonator device in which variation and leakage in a welding region due to an outer circumferential shape of a package are eliminated without hindering reduction of a size and a height of the electronic-component container, resulting in high reliability of hermetic sealing.

Means for Solving Problem

In order to achieve the object, an electronic-component container according to the present invention is provided in which a metal lid is bonded with an insulating package. The container comprises the insulating package having a housing portion for housing an electronic component element having an electrical function, a metallized sealing portion formed around the housing portion and hermetically bonded with the metal lid, and a castellation having a terminal electrode formed at a side end portion thereof, and the metal lid formed in a shape as viewed from the top which is substantially equal to a shape as viewed from the top of the insulating package, wherein a brazing material is formed on a lower surface of the metal lid, and the brazing material is provided with a welding portion which is bonded with the metallized sealing portion inside the castellation when the metal lid is bonded with the insulating package.

According to the present invention, the shape as viewed from the top of the metal lid is substantially equal to the shape as viewed from the top of the insulating package. Therefore, when the metal lid is placed on the insulating package and welding is performed, positioning of the metal lid with respect to the insulating package is easily performed without being displaced to an end portion of the insulating package. Also, the brazing material of the metal lid is provided with the welding portion which is welded to the metallized sealing portion inside the castellation of the insulating package when the metal lid is bonded with the insulating package. Therefore, the welding region does not vary due to the castellation of the insulating package, and the width of the melt region is avoided from being considerably narrowed at the castellation portion, while securing a predetermined welding region. Therefore, leakage is eliminated while increasing the stability when the metal lid is placed on the insulating package, thereby making it possible to prevent a failure of hermetic sealing. In addition, it is not necessary to increase the melting temperature as compared to the typical temperature, so that the following problems do not newly arise: the melted brazing material is scattered or the like in the housing portion (splash problem); the insulating package is broken due to melt heat distortion; and the like. In other words, an electronic-component container having a more reliable, hermetically sealed structure is obtained.

Also, in the above-described structure, a cut-away portion may be provided at a portion of an end portion of the metal lid, the cut-away portion may be configured so that, when the metal lid is bonded with the insulating package, the cut-away portion is provided close to the inside of the castellation, and the welding portion may be provided along the end portion of the metal lid.

In this case, in addition to the above-described operational effect, a cut-away portion is provided at a portion of an end portion of the metal lid, the cut-away portion is configured so that, when the metal lid is bonded with the insulating package, the cut-away portion is provided close to the inside of the castellation, and a welding portion is provided along the end portion of the metal lid, so that the welding region of the metal lid with respect to the metallized sealing portion is separated inward from the castellation, whereby the width of the melt region is avoided from being considerably narrowed at the castellation portion. Therefore, leakage is eliminated, thereby making it possible to prevent a failure of hermetic sealing. Also, by performing welding along the end portion of the metal lid, sealing can be performed while easily specifying the welding region, while separating the welding region inward from the castellation, resulting in high work efficiency. The end portion of the metal lid where a cut-away is not formed, is formed in a shape as viewed from the top which is substantially equal to the shape as viewed from the top of the insulating package, so that displacement to the end portion is eliminated, thereby making it possible to improve the stability of placement of the metal lid with respect to the insulating package.

Also, in the above-described structure, the insulating package may further include a bank portion formed around the housing portion, the housing portion may be formed in a rectangular shape as viewed from the top, the metallized sealing portion may be formed on an upper surface of the bank portion, the terminal electrode of the castellation may be formed at a side end portion of a portion of sides, the cut-away portion of the metal lid may be formed in an arc shape at the end portion side so that, when the metal lid is bonded with the insulating package, the cut-away portion is provided close to the inside of the castellation, an angle portion as viewed from the top of an end portion of the metal lid may be configured so that, when the metal lid is bonded with the insulating package, the angle portion is provided close to an angle portion as viewed from the top of the insulating package, and the welding portion may be provided along each side as viewed from the top of the metal lid.

In this case, in addition to the above-described operational effect, the insulating package further includes a bank portion, the housing portion is formed in a rectangular shape as viewed from the top, the metallized sealing portion is formed on an upper surface of the bank portion, the terminal electrode of the castellation is formed at a side end portion of a portion of sides, the cut-away portion of the metal lid is formed in an arc shape at the end portion side so that, when the metal lid is bonded with the insulating package, the cut-away portion is provided close to the inside of the castellation, an angle portion as viewed from the top of an end portion of the metal lid is configured so that, when the metal lid is bonded with the insulating package, the angle portion is provided close to an angle portion as viewed from the top of the insulating package, and the welding portion is provided along each side as viewed from the top of the metal lid. Therefore, the welding region of the metal lid with respect to the metallized sealing portion is separated inward from the castellation, whereby the width of the melt region is avoided from being considerably narrowed at the castellation portion of the melt region. Therefore, leakage is eliminated, thereby making it possible to prevent a failure of hermetic sealing. Also, since the cut-away portion has the arc shape, welding heat stress during hermetic sealing can be uniformly distributed, thereby making it possible to suppress the insulating package from being broken during sealing, for example. In addition, since the angle portion of the metal lid is provided close to the angle portion of the insulating package, when the metal lid is placed on the insulating package and welding is performed, positioning is performed using these angle portions, thereby making it easy to position the metal lid with respect to the insulating package while avoiding displacement to the end portion of the insulating package to improve the stability of placement of the metal lid with respect to the insulating package.

Also, in the above-described structure, the brazing material of the metal lid may be bonded with the metallized sealing portion of the insulating package by seam welding.

In this case, in addition to the above-described operational effect, the cut-away portion has an arc shape which does not have an angle, and therefore, when a seam roller is moved along each side of the metal lid, a contact point of the seam roller with an edge portion of each side of the metal lid is constant (one-point touch) without changing the moving direction of the seam roller, thereby making it possible to perform welding without irregularity. In other words, the following situation is avoided: the contact point of the edge portion of each side of the metal lid and the seam roller is changed into two-point touch during the movement of the seam roller, so that heating becomes insufficient or a spark occurs. Therefore, sealing is considerably stably performed by utilizing conventional sealing equipment, and leakage is eliminated, thereby making it possible to prevent a failure of hermetic sealing.

Also, in the above-described structure, the cut-away portion of the metal lid may be provided, facing end portions facing each other as viewed from the top.

In this case, in addition to the above-described operational effect, the cut-away portion of the metal lid is provided, facing end portions facing each other as viewed from the top, thereby making it possible to stably bond the metal lid with the insulating package. Particularly, this case is preferable when the metal lid is bonded with the insulating package by seam welding. This is because, in the case of seam welding, the metal lid is welded simultaneously with respect to opposed sides of the insulating package.

Also, in the above-described structure, a bolster portion for supporting housing of an electronic component element to be housed, may be provided at the angle portion as viewed from the top of the housing portion.

In the insulating package, among the portions of the metallized sealing portion for bonding the metal lid, the portion where the castellation is provided particularly has a small strength, i.e., the portion is a weak point. Also, as described above, the metallized sealing portion near the castellation has a small portion for welding (welding region) compared to the other regions of the metallized sealing portion. In contrast to this, among the portions of the metallized sealing portion provided for bonding the metal lid, the metallized sealing portion near the angle portion as viewed from the top of the housing portion particularly has a large region for welding (welding portion) compared to the other regions of the metallized sealing portion, and in this region, the insulating package has a large strength. Therefore, in the above-described structure of the present invention, a bolster portion for supporting housing of an electronic component element to be housed, is provided at an angle portion as viewed from the top of the housing portion, thereby making it possible to increase the strength of the insulating package. Therefore, problems, such as a break in the insulating package due to stress occurring due to a difference in thermal expansion coefficient between the lid and the package or melt heat distortion during hermetic sealing, and the like, do not arise, thereby obtaining an electronic-component container having a more reliable, hermetically sealed structure.

To achieve the object, a piezoelectric resonator device according to the present invention is provided in which an electronic component element having an electrical function is housed in the housing portion of the above-described electronic-component container of the present invention, and the electronic component element is a piezoelectric resonator plate which piezoelectric resonates.

According to the present invention, a piezoelectric resonator device having an operational effect similar to that of the above-described electronic-component container of the present invention, can be obtained.

EFFECTS OF THE INVENTION

According to the present invention, it is possible to eliminate leakage and prevent a failure of hermetic sealing while increasing the stability of placement of a metal lid with respect to an insulating package without hindering reduction of a size and a height of an electronic-component container. In addition, an electronic-component container and a piezoelectric resonator device having a more reliable, hermetically sealed structure are obtained without the following problems: a melted brazing material or the like is scattered in a housing portion (splash problem), or the package is broken due to melt heat distortion.

Figure 1:
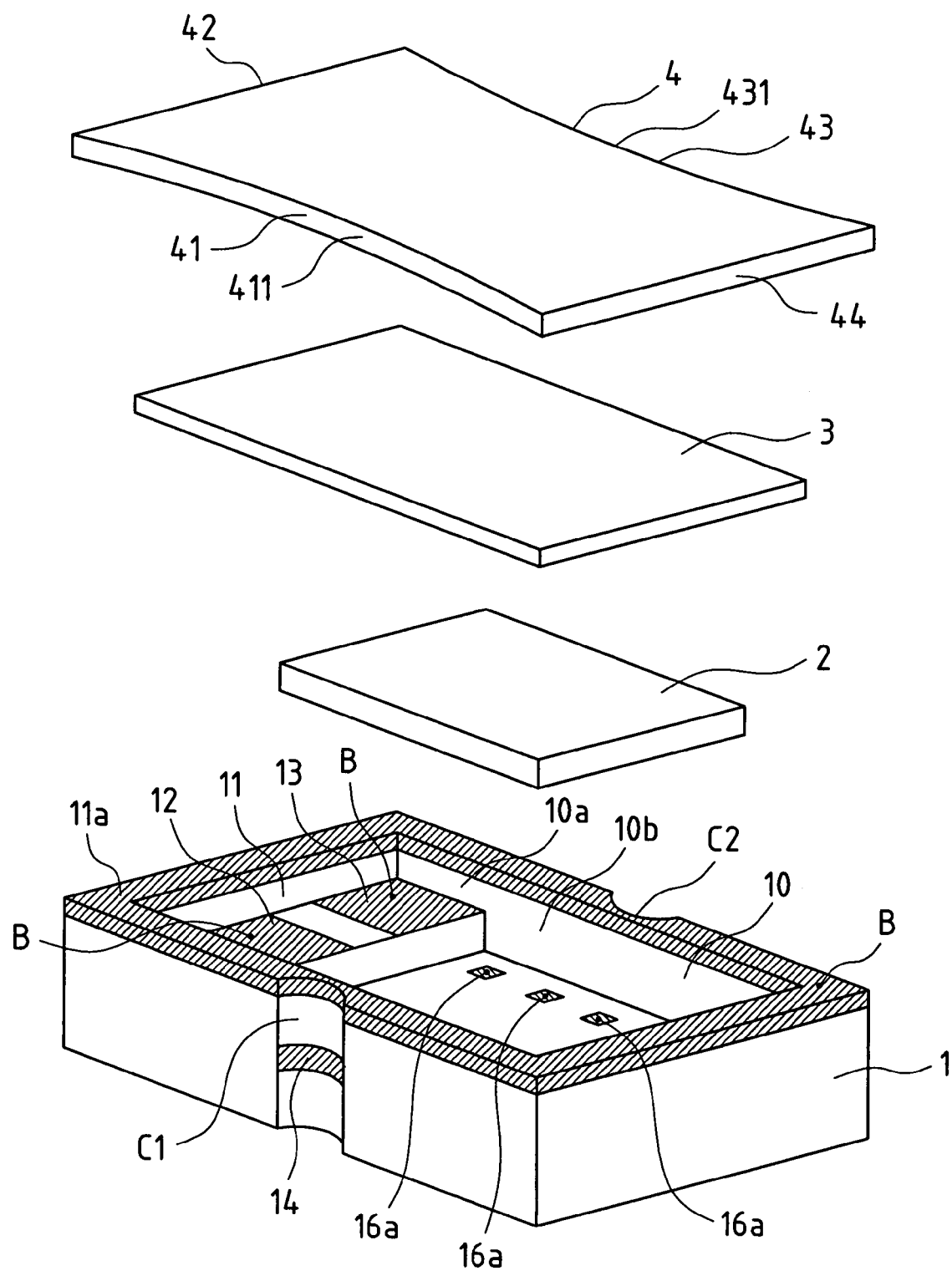
FIG. 1 is an exploded perspective view illustrating a first embodiment.

DESCRIPTION OF REFERENCE NUMERALS 1 ceramic package
2 integrated circuit element
3 piezoelectric resonator plate
4 metal lid

BEST MODE FOR CARRYING OUT THE INVENTION

Figure 2:
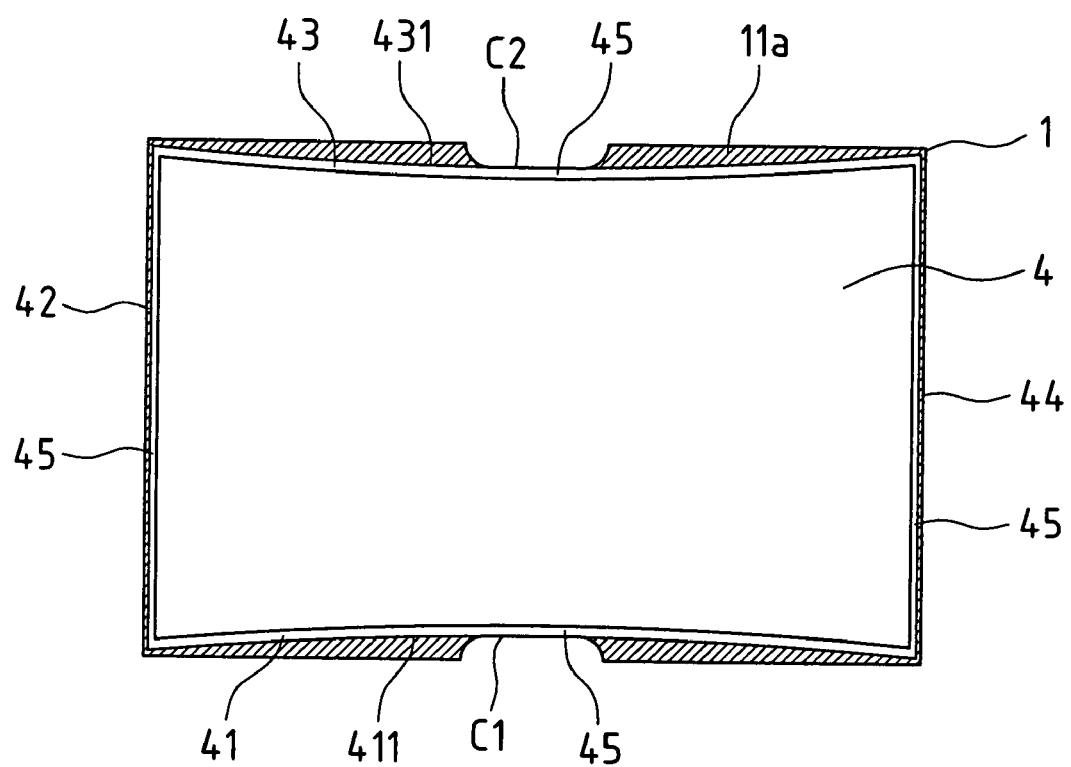
FIG. 2 is a plan view of a state in which a metal lid of FIG. 1 is sealed.

Hereinafter, preferred embodiments of an electronic-component container according to the present invention will be described with reference to the accompanying drawings. A first embodiment of the present invention will be described with reference to FIGS. 1 and 2, where a surface mount type crystal oscillator is illustrated. FIG. 1 is an exploded perspective view of the first embodiment, and FIG. 2 is a plan view of a state in which a metal lid of FIG. 1 is sealed. The surface mount type crystal oscillator (a piezoelectric resonator device as used herein) comprises a ceramic package (an insulating package as used herein) 1 having a concave portion which is open upward, a semiconductor integrated circuit 2 (an electronic component element having an electrical function as used herein) housed in the ceramic package 1, a piezoelectric resonator plate 3 (an electronic component element having an electrical function as used herein) housed at an upper portion of the same ceramic package 1, and a metal lid 4 bonded with an opening portion of the ceramic package 1.

The ceramic package 1 is formed as a whole in the shape of a cuboid, is composed of appropriately laminated layers of a ceramic (alumina, etc.) and a conductive material (tungsten, etc.), and has a housing portion 10 having a concave-shaped cross-section. The housing portion 10 comprises an upper housing portion 10a and a lower housing portion 10b which house the piezoelectric resonator plate 3 and the integrated circuit element 2, respectively. A bank portion 11 is formed around the housing portion 10, and has a flat upper surface. On the bank portion 11, a first metal layer 11a (a metallized sealing portion as used herein) is formed. The first metal layer 11a also has a flat upper surface. The first metal layer 11a is composed of a metal film layer including layers of tungsten, nickel, and gold which are successively laminated from the bank portion 11. The tungsten is integrally formed using a metallization technique when the ceramic is baked, and the nickel and gold layers are formed using a plating technique.

A pair of castellations C1 and C2 extending vertically are formed at substantially centers in a longer-side direction of longer-side end portions of the ceramic package 1. The castellations C1 and C2 are arc-shaped cut-away structures (semicircular concave portions) which are vertically formed at substantially the centers in the longer-side direction of the longer-side end portions of the ceramic package 1. Note that electrodes (external piezoelectric vibrator measuring terminal electrodes 14 and 15 described below) are formed at the pair of castellations C1 and C2.

Note that the first metal layer 11a is connected to a conductive via B which is formed, penetrating vertically through the bank portion 11 at an angle portion of the ceramic package 1, and is electrically led via the conductive via B to an external connection electrode (not shown) formed on a lower surface of the ceramic package 1. By connecting the externally leading electrode to the ground, the metal lid 4 (described below) is grounded via the metal layer 11a, the conductive via B, and the externally leading electrode, thereby making it possible to obtain an electromagnetic shield effect for an electronic component. Note that the conductive via B can be formed using a well-known ceramic lamination technique, such as that described above.

In the ceramic package 1, the lower housing portion 10b for housing the integrated circuit element 2 is formed on a lowest bottom surface as described above. In the upper housing portion 10a over the lower housing portion 10b, electrode pads 12 and 13 connected to the piezoelectric resonator plate 3 are formed side by side in a shorter-side direction at an end in the longer-side direction. The electrode pads 12 and 13 are formed close to each other inside the ceramic package 1. Each of the electrode pads 12 and 13 is connected via the conductive via B to the integrated circuit element 2 (described below). The electrode pads 12 and 13 are extended out as the external piezoelectric vibrator measuring terminal electrodes 14 and 15 formed at the pair of castellations C1 and C2.

A plurality of connection pads 16a connected to the integrated circuit element 2 are formed side by side on an upper surface of the lower housing portion 10b.

The ceramic package 1 having such a structure is formed using a well-known ceramic lamination technique or metallization technique. The electrode pads 12 and 13 and the connection pad 16a are formed by successively laminating a nickel plated layer and a gold plated layer on an upper surface of a metallized layer of tungsten or the like, in a manner similar to that of formation of the metal layer 11a.

The integrated circuit element 2 provided in the lower housing portion 10b is an one-chip integrated circuit element which constitutes an oscillation circuit with the piezoelectric resonator plate 3. On a lower surface of the integrated circuit element 2, a plurality of connection terminals (not shown) are formed. The integrated circuit element 2 of this embodiment employs a bare chip. The plurality of connection terminals of the integrated circuit element 2 and the plurality of connection pads 16a formed on the upper surface of the lower housing portion 10b are connected using a face-down bonding technique. Note that a gap between the lower housing portion 10b and the integrated circuit element 2 may be filled with a resin material.

The piezoelectric resonator plate 3 is provided over the integrated circuit element 2 via a predetermined gap. The piezoelectric resonator plate 3 is a rectangular AT-cut crystal resonator plate. A pair of rectangular drive electrodes (not shown) and extension electrodes (not shown) which extend the drive electrodes to an outer circumference of the crystal resonator plate are provided, facing front and rear surfaces of the piezoelectric resonator plate 3. These electrodes can be formed using a thin-film forming technique, such as a vacuum deposition technique, a sputtering technique, or the like.

The piezoelectric resonator plate 3 and the ceramic package 1 are bonded together as follows. For example, a conductive bonding material (not shown) is supplied onto upper surfaces of the electrode pads 12 and 13 in an appropriate amount using a dispenser or the like. Thereafter, the piezoelectric resonator plate 3 is placed on the electrode pads 12 and 13. Thereby, the extension electrodes of the piezoelectric resonator plate 3 are electro-mechanically connected to the electrode pads 12 and 13, and optionally, the extension electrode portions of the piezoelectric resonator plate 3 may be overcoated with a conductive bonding material (not shown) again. Note that the conductive bonding material is a paste and is, for example, a silicone conductive resin adhesive containing small metal pieces (e.g., a silver filler, etc.). In addition to the silicone conductive resin adhesive, urethane, imide, polyimide and epoxy conductive resin adhesives can be used. The bonding of the piezoelectric resonator plate 3 and the ceramic package 1 is not limited to conductive bonding materials. The piezoelectric resonator plate 3 may be electro-mechanically bonded with the ceramic package using a bump. Bumps require a small region for bonding compared to conductive bonding materials, and are preferable for miniaturization of the crystal oscillator.

The metal lid 4 which hermetically seals the ceramic package 1 is a flat plate having a rectangular shape as viewed from the top. The metal lid 4 is composed of a core material (not shown) made of kovar and a metal brazing material as a second metal layer (not shown), and more specifically, for example, has a multi-layer structure composed of a nickel layer, a kovar core material, a copper layer, and a silver wax layer in this order from the upper surface. The silver wax layer (second metal layer) is bonded with the first metal layer 11a of the ceramic package 1. A portion of the silver wax layer (second metal layer) is provided as a welding portion 45 for bonding to the first metal layer 11a of the ceramic package 1. The welding portion 45 is provided along end portions of the metal lid 4 (an outer circumference as viewed from the top). An outer shape as viewed from the top of the metal lid 4 is substantially the same as or slightly smaller than an outer shape of the ceramic package 1. Longer sides 41 and 43 of the metal lid 4 have arc-shaped cut-away portions 411 and 431 which have no angle, so that the longer sides 41 and 43 touch end portions of the castellations C1 and C2 of the ceramic package 1 (provided close to the inside of the castellations C1 and C2) when the metal lid 4 is bonded with the ceramic package 1. These arc-shaped cut-away portions 411 and 431 are provided, facing the longer sides 41 and 43 (end portions as used herein) of the metal lid 4 facing each other as viewed from the top. Angle portions of the metal lid 4 (specifically, four corner portions as viewed from the top) are provided close to angle portions of the ceramic package 1 (specifically, four corner portions as viewed from the top). As used herein, the arc-shaped cut-away portions 411 and 431 refer to the shapes of the longer sides 41 and 43 which are bent in a direction in which the pair of longer sides 41 and 43 approaches each other, as compared to the metal lid having a rectangular shape as viewed from the top. As used herein, the angle refers to an angularly bent portion. The cut-away portions 411 and 431 of this embodiment have no angularly bent portion, and have continuous curved surfaces (curves as viewed from the top).

Figure 3:
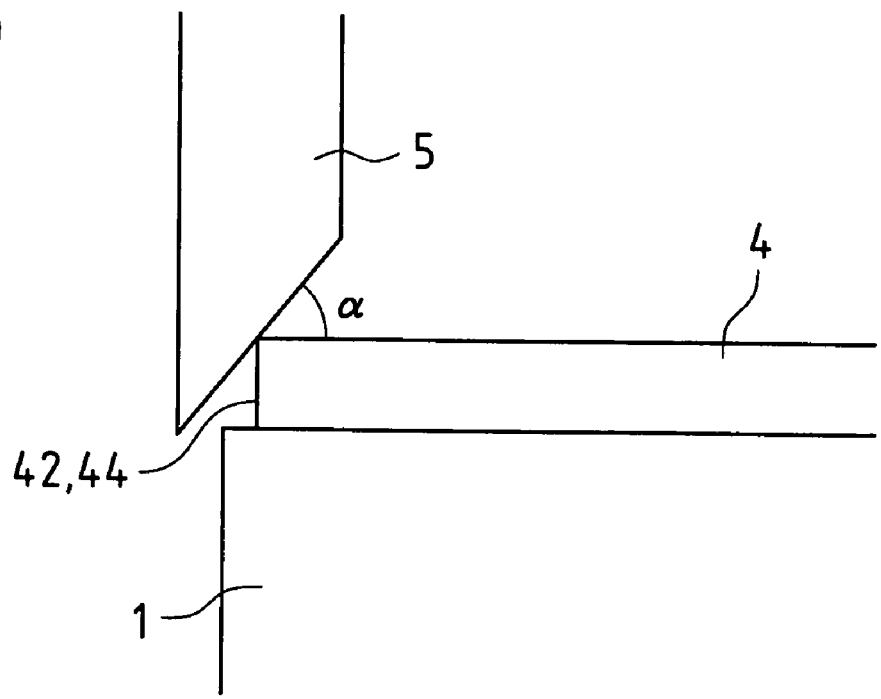
FIG. 3 is a diagram illustrating seam bonding of the metal lid and a ceramic package of the first embodiment, and (a) is a diagram illustrating seam bonding of the metal lid and the ceramic package at a shorter side of the metal lid, and (b) is a diagram illustrating seam bonding of the metal lid and the ceramic package at a longer side of the metal lid.
Figure 3:
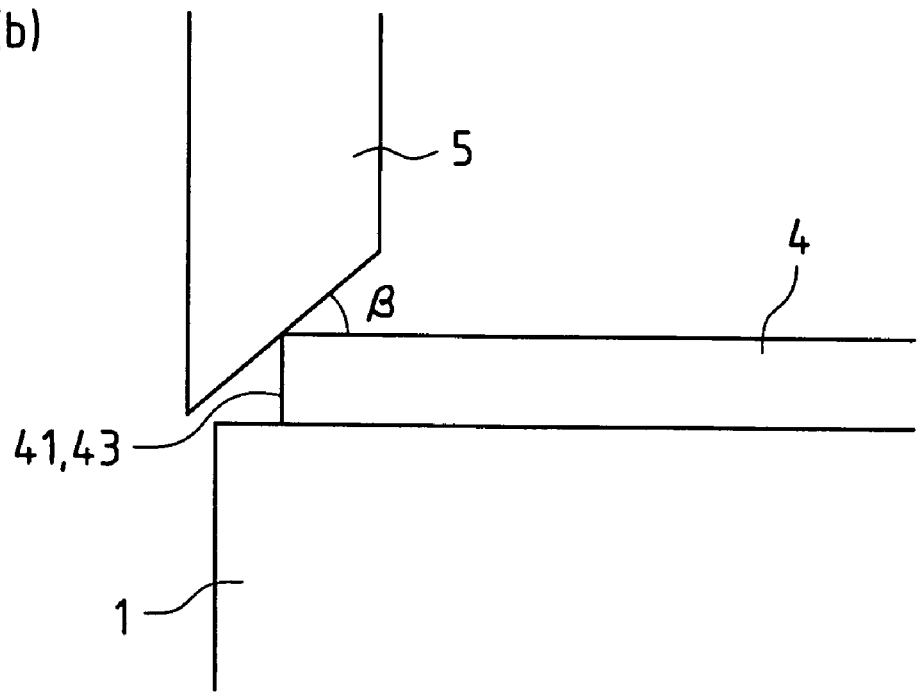

The integrated circuit element 2 and the piezoelectric resonator plate 3 are housed in the housing portion 10 of the ceramic package 1, which is in turn covered with the metal lid 4. The first metal layer 11a of the ceramic package 1 and the second metal layer of the metal lid 4 are melted and cured, resulting in hermetic sealing. In this embodiment, hermetic sealing is achieved by direct seam welding (direct seam sealing) without using a metal sealing ring. By moving a seam roller (see reference numeral 5 in FIG. 3) along edge portions of the longer sides 41 and 43 and the shorter sides 42 and 44 of the metal lid 4, the silver wax layer (second metal layer) formed on the metal lid 4 and the first metal layer 11a (metallized sealing portion) of the ceramic package 1 are welded, thereby achieving hermetic sealing. In this case, since the welding portion 45 (a portion of the silver wax layer) is provided along the end portions of the metal lid 4, the welding portion 45 is located inside the castellations C1 and C2. Note that, in the case of the direct seam welding of this embodiment, regarding the metal lid 4, different settings are provided for seam welding of the metal lid 4 to the ceramic package 1 at the longer sides 41 and 43 which are provided with the cut-away portions 411 and 431, and seam welding of the metal lid 4 to the ceramic package 1 at the shorter sides 42 and 44 which are not provided with a cut-away portion. Specifically, as illustrated in FIG. 3, an angle of a roller surface of the seam roller 5 with respect to the metal lid 4 when the silver wax layer (second metal layer) formed at the shorter sides 42 and 44 of the metal lid 4 and the first metal layer 11a (metallized sealing portion) of the ceramic package 1 are welded, is represented by a, and an angle of the roller surface of the seam roller 5 with respect to the metal lid 4 when the silver wax layer (second metal layer) formed at the longer sides 41 and 43 of the metal lid 4 and the first metal layer 11a (metallized sealing portion) of the ceramic package 1 are welded, is represented by β, and the angle α is set to be more obtuse than the angle β. Thus, regarding the metal lid 4, by providing different settings for the seam welding of the metal lid 4 to the ceramic package 1 at the longer sides 41 and 43 which are provided with the cut-away portions 411 and 431, and the seam welding of the metal lid 4 to the ceramic package 1 at the shorter sides 42 and 44 which are not provided with a cut-away portion, seam welding can be stably achieved at different locations of the metal lid 4 on the ceramic package 1, i.e., at the longer sides 41 and 43 which are provided with the cut-away portions 411 and 431 and the shorter sides 42 and 44 which are not provided with a cut-away portion. In other words, when the silver wax layer (second metal layer) formed at the longer sides 41 and 43 of the metal lid 4 and the first metal layer 11a (metallized sealing portion) of the ceramic package 1 are welded, where the angle of the roller surface of the seam roller 5 with respect to the metal lid 4 is α, the roller surface of the seam roller 5 touches not only the metal lid 4 but also the ceramic package 1. In this case, a leakage current occurs which directly flows through the ceramic package 1 without via a contact resistance between the metal lid 4 and the ceramic package 1, so that heating is insufficient at a welding portion, and therefore, seam welding cannot be performed.

By employing the above-described structure, when bonding is performed with respect to the ceramic package 1, the welding portion 45 at which the silver wax layer (second metal layer) of the metal lid 4 is welded with the first metal layer 11a (metallized sealing portion) is located farther inside than the castellations C1 and C2 (separated inwardly with respect to the castellations C1 and C2). Therefore, a melt region of the welding portion 45 is avoided from being considerably narrowed at the location of the first metal layer 11a where the castellations C1 and C2 are formed (specifically, when the cut-away portions 411 and 431 are provided in the metal lid 4, a width in the shorter-side direction of the ceramic package 1 of the welding region of the welding portion 45). Therefore, leakage is eliminated, thereby making it possible to prevent a failure of hermetic sealing. Note that, it was confirmed according to experiments that if 0.08 mm or more is secured as the width of the welding portion 45, leakage does not occur. It is preferable that the welding portion 45 of 0.08 mm or more be formed in the region of the bank portion 11 and farther inside the ceramic package 1 than the castellations C1 and C2. Also, since the cut-away portions 411 and 431 have the arc shape, welding heat stress during hermetic sealing can be uniformly distributed, thereby making it possible to suppress the ceramic package 1 from being broken during sealing, for example. In addition, since the cut-away portions 411 and 431 have the arc shape which does not have an angle, when the seam roller 5 is moved along the longer sides 41 and 43 of the metal lid 4, a contact point of the seam roller 5 with the edge portions of the longer sides 41 and 43 of the metal lid 4 is constant without changing the moving direction of the seam roller 5, thereby making it possible to perform welding without irregularity. The cut-away portions 411 and 431 having the same arc shape are formed at opposed sides of the metal lid 4 (the longer sides 41 and 43 in this embodiment), and therefore, are symmetric about a line. Therefore, it is no longer necessary to determine an orientation in a plane direction when the metal lid 4 is placed on the ceramic package 1, leading to a high level of productivity. Therefore, sealing can be considerably stably performed by utilizing conventional sealing equipment, thereby making it possible to eliminate leakage and thereby prevent a failure of hermetic sealing. In addition, since the angle portions of the metal lid 4 are provided close to the angle portions of the ceramic package 1, when the metal lid 4 is placed on the ceramic package 1 and welding is performed, positioning is performed using the corresponding angle portions, thereby making it possible to eliminate a displacement to improve the stability of placement of the metal lid 4 with respect to the ceramic package 1.

Also, since the cut-away portions 411 and 431 of the metal lid 4 are provided, facing the longer sides 41 and 43 (end portions) facing each other as viewed from the top, the metal lid 4 can be stably bonded with the ceramic package 1. Particularly, the metal lid 4 is preferably bonded with the ceramic package 1 by seam welding. This is because, in seam welding, the metal lid 4 is bonded simultaneously at opposed sides (the longer sides 41 and 43 in this embodiment) of the ceramic package 1.

Also, when the ceramic package 1 and the metal lid 4 are bonded together by seam bonding as indicated in this embodiment, it is preferable that the cut-away portions 411 and 431 have an arc shape as indicated in this embodiment.

Figure 4:
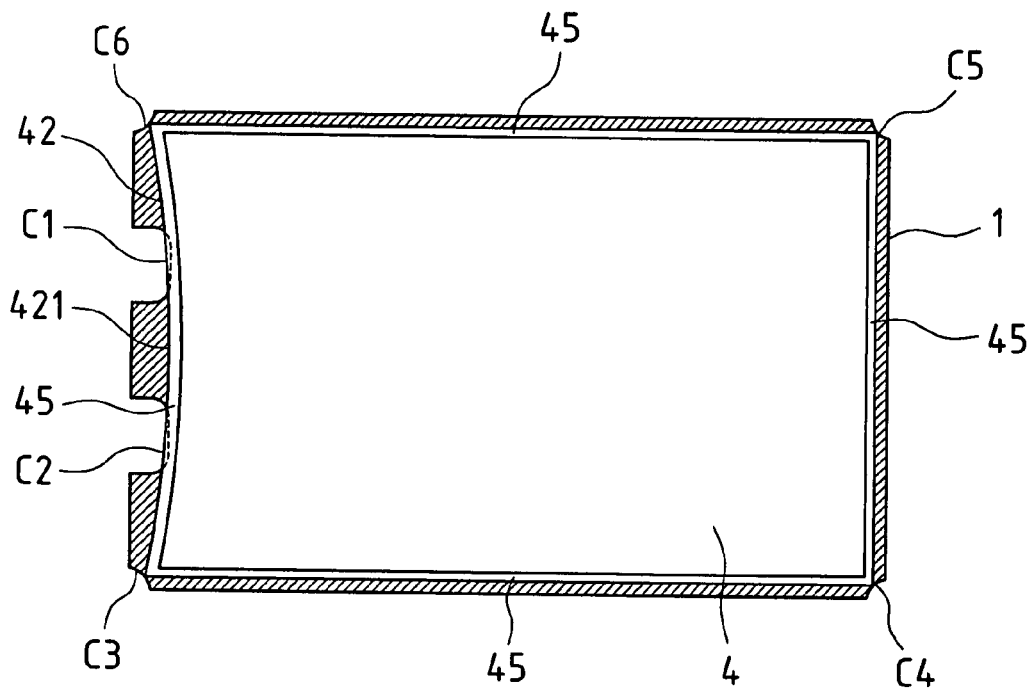
FIG. 4 is a plan view illustrating a second embodiment.

The present invention is not limited to the above-described embodiment. For example, various structures can be employed, depending on the locations of the castellations C1 and C2 of the ceramic package 1. A structure different from that of this embodiment is illustrated in FIG. 4. FIG. 4 is a plan view illustrating a second embodiment according to the present invention. The basic structure is the same as that of the first embodiment, and therefore, the same components are indicated with the same reference numerals and a part thereof will not be described.

In the second embodiment, as is different from the first embodiment, castellations C1 and C2 are formed only at one of the shorter-side end portions of a ceramic package 1, and castellations C3, C4, C5, and C6 are formed at four angle side end portions of the ceramic package 1.

Also, as is different from the first embodiment, a cut-away portion 421 is provided at one shorter side 42 of the metal lid 4. The cut-away portion 421 has an arc-shape without an angle so that, when the metal lid 4 is bonded with the ceramic package 1, the arc-shaped cut-away portion 421 slightly overlaps the castellations C1 and C2 of the ceramic package 1 (provided close to the inside of the castellations C1 and C2). Also, when the metal lid 4 is bonded with the ceramic package 1, the angle portions of the metal lid 4 slightly overlap the castellations C3, C4, C5, and C6 of the ceramic package 1.

Also in the second embodiment, hermetic sealing is performed using direct seam welding. In this case, a welding portion 45 is provided along end portions of the metal lid 4. Therefore, the metal lid 4 is provided with the welding portion 45 in a manner that, even if the cut-away portion 421 slightly overlaps the castellations C1 and C2, the welding portion 45 is located inside the castellations C1 and C2 when the metal lid 4 is bonded with the ceramic package 1. Therefore, a melt region is avoided from being considerably narrowed (specifically, when the cut-away portion 421 is provided in the metal lid 4, a width in the longer-side direction of the ceramic package 1 of the welding region of the welding portion 45). For the other sides which do not have the castellations C1 and C2 of the ceramic package 1, since the cut-away portion 421 is not formed, the width of the melt region is not narrowed. The angle portion of the metal lid 4 is a region which is touched by the seam roller 5 twice, so that the width of the melt region is large compared to the side portion, and therefore, leakage is not likely to occur at the angle portion. Therefore, in the second embodiment, a cut-away portion is not provided for the castellations C3, C4, C5, and C6. A cut-away portion may be provided for the castellations C3, C4, C5, and C6 as required.

Note that, in the above-described embodiments of the present invention, the cut-away portions 411, 431 and 421 of the metal lid 4 may be formed, corresponding to the castellations C1 and C2 formed at side end portions of sides (longer-sides or shorter-sides) of the ceramic package 1. When castellations are present on three or four sides, cut-away portions may be formed for the three or four sides.

Figure 5:
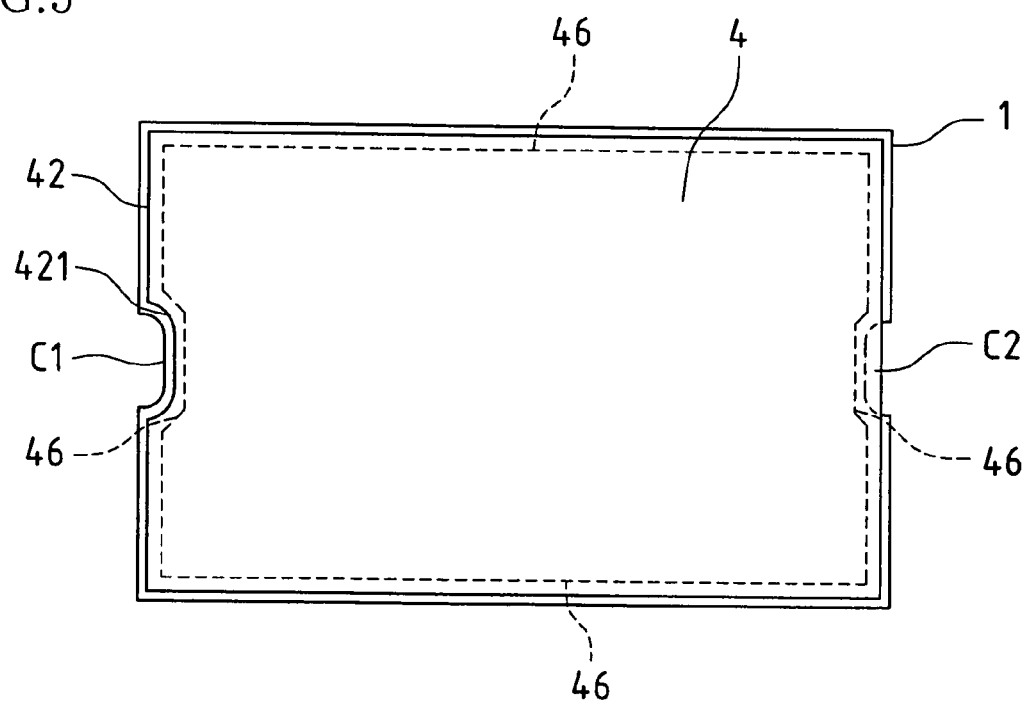
FIG. 5 is a plan view illustrating a third embodiment.

The present invention is not limited to the above-described embodiments. For example, a structure employing beam sealing can be used. FIG. 5 illustrates an example which employs a structure different from that of this embodiment. FIG. 5 is a plan view illustrating a third embodiment of the present invention. The basic structure is the same as that of the first embodiment, and therefore, the same components are indicated with the same reference numerals and a part thereof will not be described.

In the third embodiment, castellations C1 and C2 are formed at both (a pair of shorter-side end portions of a ceramic package 1. In contrast to this, a metal lid 4 is provided with a quadrangular cut-away portion 421 only at one shorter side 42. The cut-away portion 421 is provided close to the inside of the castellation C1 of the ceramic package 1. Also, when the metal lid 4 is provided with a welding portion 46 which is located inside the castellations C1 and C2 when the metal lid 4 is bonded with the ceramic package 1.

In this embodiment, the ceramic package 1 and the metal lid 4 are hermetically sealed by beam welding employing an electron beam or the like (beam sealing). In this case, the electron beam is scanned along a portion located slightly inward from end portions of the metal lid 4. In this case, since a cut-away portion is not formed at a portion of the metal lid 4 where the castellation C2 is present, the electron beam is scanned to a location more inward from the end portion of the metal lid 4 of the castellation C2. Thus, the welding portion 46 is provided inside the castellations C1 and C2, and therefore, a melt region is avoided from being considerably narrowed (specifically, when the cut-away portion 421 is provided in the metal lid 4, a width in the longer-side direction of the ceramic package 1 of the welding region of the welding portion 45). Therefore, leakage is eliminated, thereby making it possible to prevent a failure of hermetic sealing.

Figure 6:
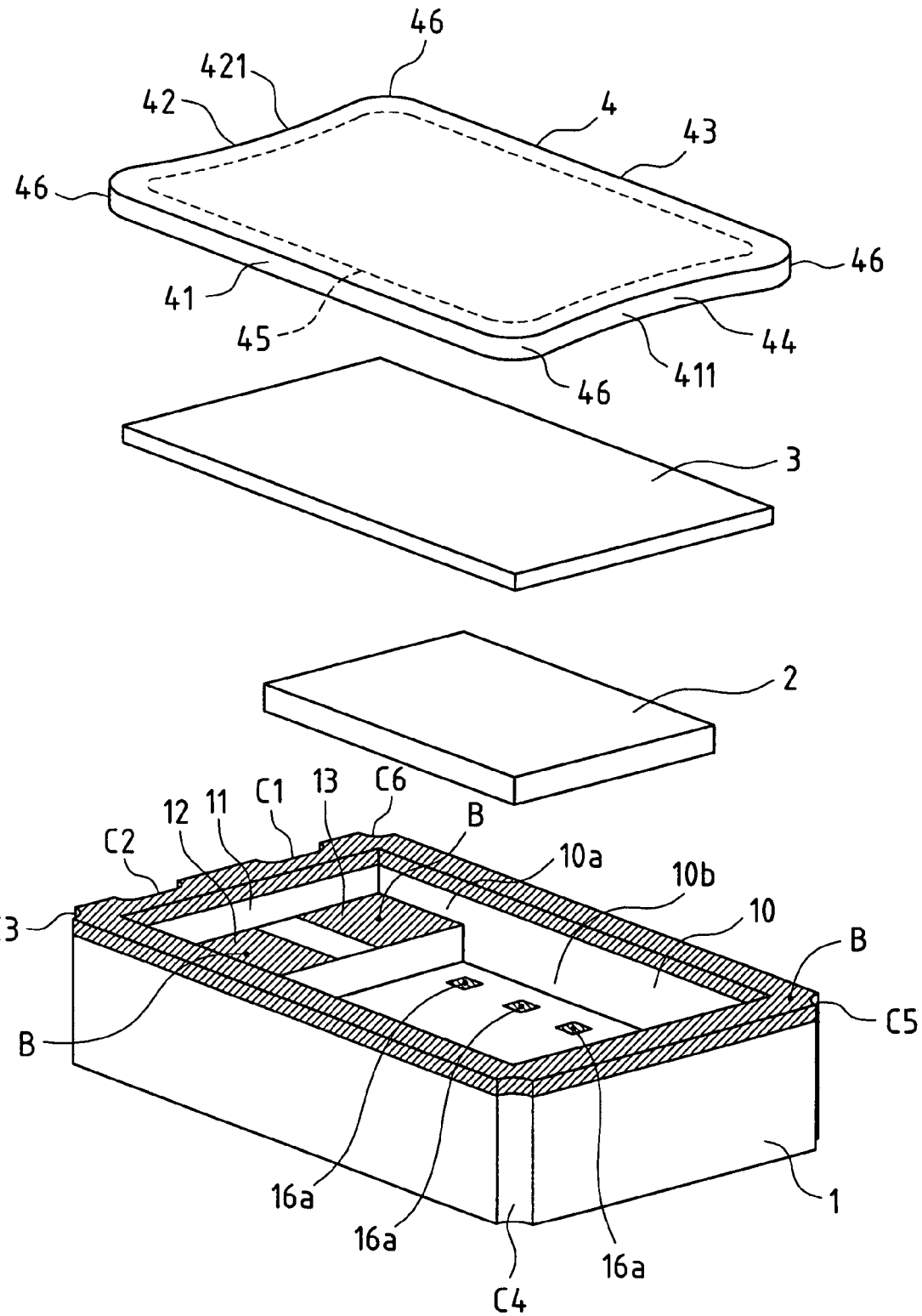
FIG. 6 is an exploded perspective view illustrating a fourth embodiment.

The present invention is not limited to the above-described embodiment. For example, the shape of the metal lid 4 may be formed into other shapes having a cut-away portion. For example, the metal lid 4 may has a shape, such as that illustrated in FIG. 6. Hereinafter, the structure of FIG. 6 different from that of the above-described embodiments will be illustrated. FIG. 6 is an exploded perspective view illustrating a fourth embodiment of the present invention. The basic structure is the same as that of the second embodiment, and therefore, the same components are indicated with the same reference numerals and a part thereof will not be described.

A crystal oscillator according to the fourth embodiment comprises a ceramic package 1, a semiconductor integrated circuit 2 (an electronic component element having an electrical function) housed in the ceramic package 1, a piezoelectric resonator plate 3 (an electronic component element having an electrical function) housed in an upper portion of the ceramic package 1, and a metal lid 4 which is bonded with the ceramic package 1.

The metal lid 4 has a flat plate structure having a rectangular shape as viewed from the top, and is composed of a core material (not shown) made of kovar and a metal brazing material as a second metal layer (not shown). More specifically, for example, the metal lid 4 has a multi-layer structure including a nickel layer, a kovar core material, a copper layer, and a silver wax layer in this order from the upper surface. The silver wax layer (second metal layer) is bonded with the first metal layer 11a of the ceramic package 1. The welding portion 45 of this embodiment is provided along end portions (an outer circumference as viewed from the top) of the metal lid 4. The shorter sides 42 and 44 of the metal lid 4 are provided with arc-shaped cut-away portions 421 and 441 which do not have an angle, so that the shorter sides 42 and 44 do not overlap end portions of the castellations C1 and C2 of the ceramic package 1 (provided close to the inside of the castellations C1 and C2) when the metal lid 4 is bonded with the ceramic package 1. Also, angle portions 46 (specifically, four corner portions as viewed from the top) of the metal lid 4 have an arc shape, and are provided close to angle portions (specifically, four corner portions as viewed from the top) of the ceramic package 1. Due to the arc shape formation of the angle portion 46 of the metal lid 4, the metal lid 4 of this embodiment does not overlap castellations C3, C4, C5 and C6 of the ceramic package 1 when the metal lid 4 is bonded with the ceramic package 1, as compared to the metal lid 4 of FIGS. 1 and 2.

Also in the fourth embodiment, hermetic sealing is performed using direct seam welding. In this case, since the welding portion 45 is provided along the end portions of the metal lid 4, the cut-away portions 421 and 441 and the angle portion 46 do not overlap the castellations C1 to C6. Specifically, the metal lid 4 is provided with the welding portion 45 in a manner that, when the metal lid 4 is bonded with the ceramic package 1, the welding portion 45 is located inside the castellations C1 and C2. Therefore, a welding region (a welding region with the first metal layer for touching the metal lid 4 of the ceramic package 1) is avoided from being considerably narrowed. Therefore, leakage is eliminated, thereby making it possible to prevent a failure of hermetic sealing.

Figure 7:
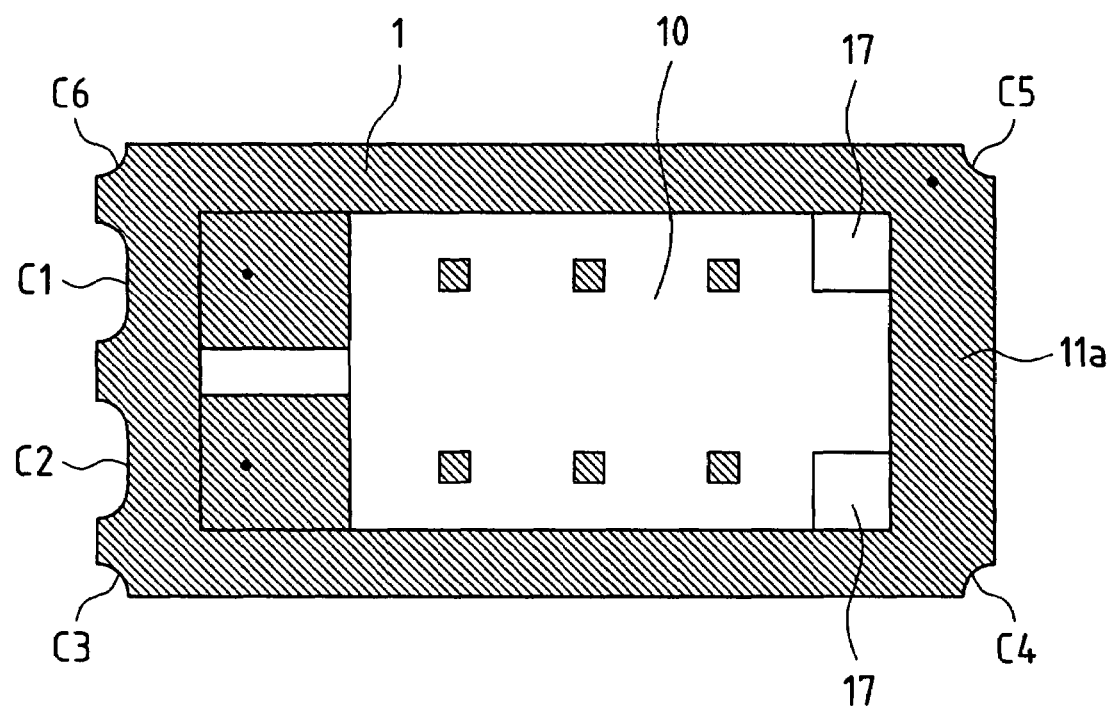
FIG. 7 is a plan view of a ceramic package according to a fifth embodiment.
Figure 8:
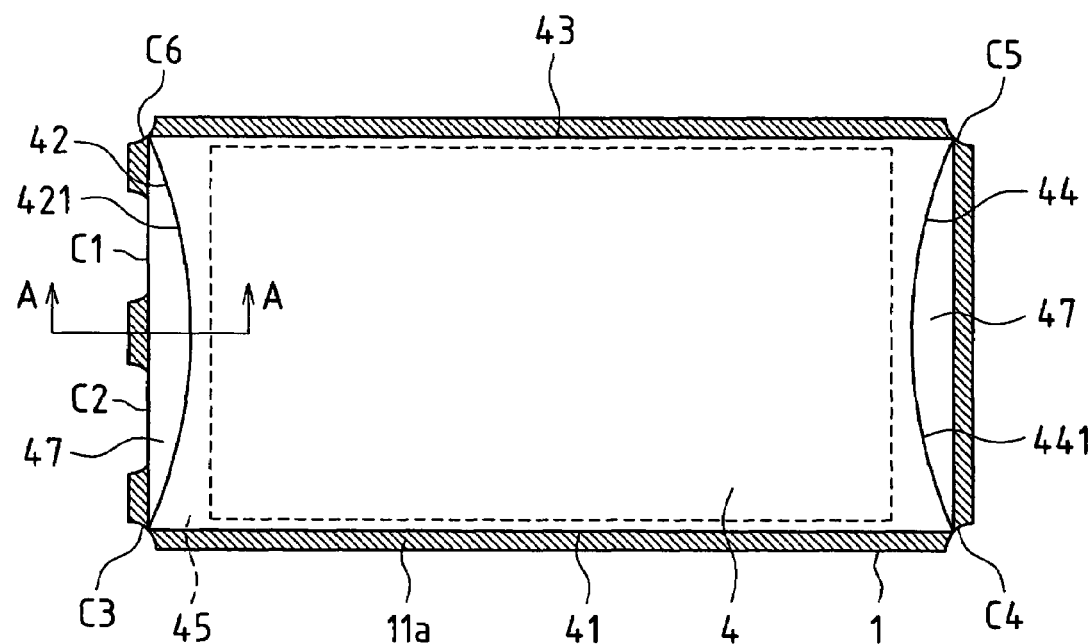
FIG. 8(a) is a plan view illustrating the fifth embodiment.
FIG. 8(b) is a partial cross-sectional view thereof, taken along line A-A of (a).
Figure 8:
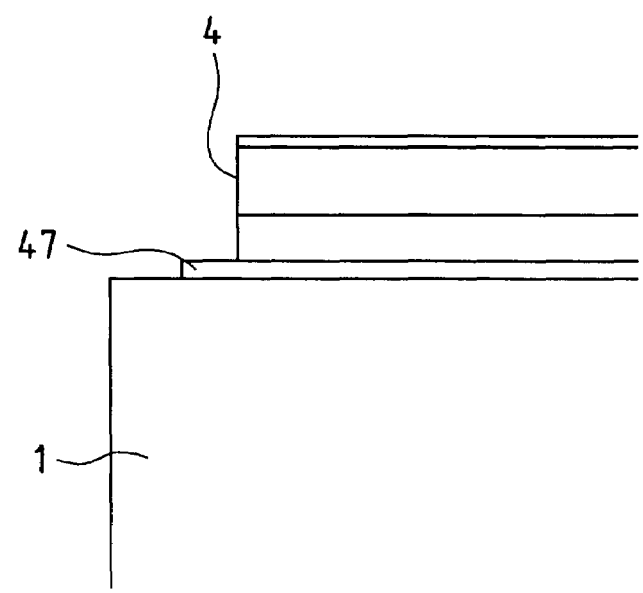

The present invention is not limited to the above-described embodiment. For example, the ceramic package 1 and the metal lid 4 may have a structure, such as that illustrated in FIGS. 7 and 8. FIG. 7 is a plan view illustrating a ceramic package 1 of a fifth embodiment of the present invention. FIG. 8 illustrates a plan view illustrating the fifth embodiment of the present invention and a partial cross-sectional view thereof, taken along line A-A. The basic structure is the same as that of the second and fourth embodiments, and therefore, the same components are indicated with the same reference numerals and a part thereof will not be described.

In the crystal oscillator according to the fifth embodiment, the ceramic package 1 is provided with bolster portions 17 which support housing of a piezoelectric resonator plate 3 to be housed. The bolster portions 17 are provided at angle portions (as viewed from the top) of a housing portion 10. However, in a ceramic package 1, among the portions of a first metal layer 11a (metallized sealing portion) for bonding a metal lid 4, portions where castellations C1 and C2 are provided particularly have a small strength, i.e., these portions are weak points. Also, as described above, the first metal layer 11a near the castellations C1 and C2 has small portions for welding (welding regions) compared to the other regions of the first metal layer 11a. In contrast to this, among the portions of the first metal layer 11a provided for bonding the metal lid 4, the first metal layer 11a near the angle portions (as viewed from the top) of the housing portion 10 particularly have large regions for welding (welding portions) compared to the other regions of the first metal layer 11a, and in these regions, the ceramic package 1 has a large strength. Regarding the strength of the ceramic package 1, when the strength is compared between a location near the angle portion (as viewed from the top) of the housing portion 10 and locations other than the location near the angle portion, stress is more easily locally concentrated into the locations other than the location near the angle portion than into the location near the angle portion. Therefore, when the bolster portions 17 are provided at the locations other than the location near the angle portion (as viewed from the top) of the housing portion 10 so that the bolster portions 17 are used as auxiliary supports for the piezoelectric resonator plate 3, a break is likely to occur the locations where the auxiliary supports are provided for the piezoelectric resonator plate 3 of the ceramic package 1. In contrast to this, in this embodiment, the bolster portion 17 is provided near the angle portion, so that the locations other than the location near the angle portion are not a weak point, and the bolster portion 17 can provide auxiliary support for the piezoelectric resonator plate 3 without locally concentrating stress. Also, by providing the bolster portion 17 near the angle portion (as viewed from the top) of the housing portion 10, the bolster portion 17 has a bracing effect, thereby making it possible to suppress deformation of the whole ceramic package 1.

As described above, in this embodiment, the bolster portion 17 is provided which supports housing of the piezoelectric resonator plate 3 (electronic component element) housed at the angle portion (as viewed from the top) of the housing portion 10, thereby obtaining an electronic-component container having a more reliable, hermetically sealed structure in which the strength of the ceramic package 1 can be increased and problems, such as a break of the ceramic package 1 due to melt heat distortion, and the like, do not occur. Note that, in this embodiment, the castellations C1 and C2 are provided with an upper housing portion 10a which is a portion for holding the piezoelectric resonator plate 3, thereby increasing the strength of the ceramic package 1.

The metal lid 4 has a flat plate structure having a rectangular shape as viewed from the top, and is composed of a core material (not shown) made of kovar and a metal brazing material as a second metal layer (not shown). More specifically, for example, the metal lid 4 has a multi-layer structure including a nickel layer, a kovar core material, a copper layer, and a silver wax layer in this order from the upper surface. The silver wax layer (second metal layer) is bonded with the first metal layer 11a of the ceramic package 1. A welding portion 45 of this embodiment is provided along end portions (an outer circumference as viewed from the top) of the metal lid 4. Shorter sides 42 and 44 of the metal lid 4 are provided with arc-shaped cut-away portions 421 and 441 so that the shorter sides 42 and 44 do not overlap end portions of the castellations C1 and C2 of the ceramic package 1 (provided close to the inside of the castellations C1 and C2) when the metal lid 4 is bonded with the ceramic package 1. Also, a silver wax layer 47 (second metal layer) is exposed below the cut-away portions 421 and 441 of the metal lid 4.

Also in the fifth embodiment, hermetic sealing is performed using direct seam welding. In this case, the welding portion 45 including the exposed silver wax layer 47 is provided close to the end portions of the metal lid 4. Specifically, the metal lid 4 is provided with the welding portion 45 in a manner that, when the metal lid 4 is bonded with the ceramic package 1, the welding portion 45 is also located inside the castellations C1 and C2, and the exposed silver wax layer is provided. Therefore, a welding region (a welding region with the first metal layer for touching the metal lid 4 of the ceramic package 1) can be increased as compared to the embodiment of FIG. 6. Therefore, leakage is eliminated, thereby making it possible to prevent a failure of hermetic sealing.

Figure 9:
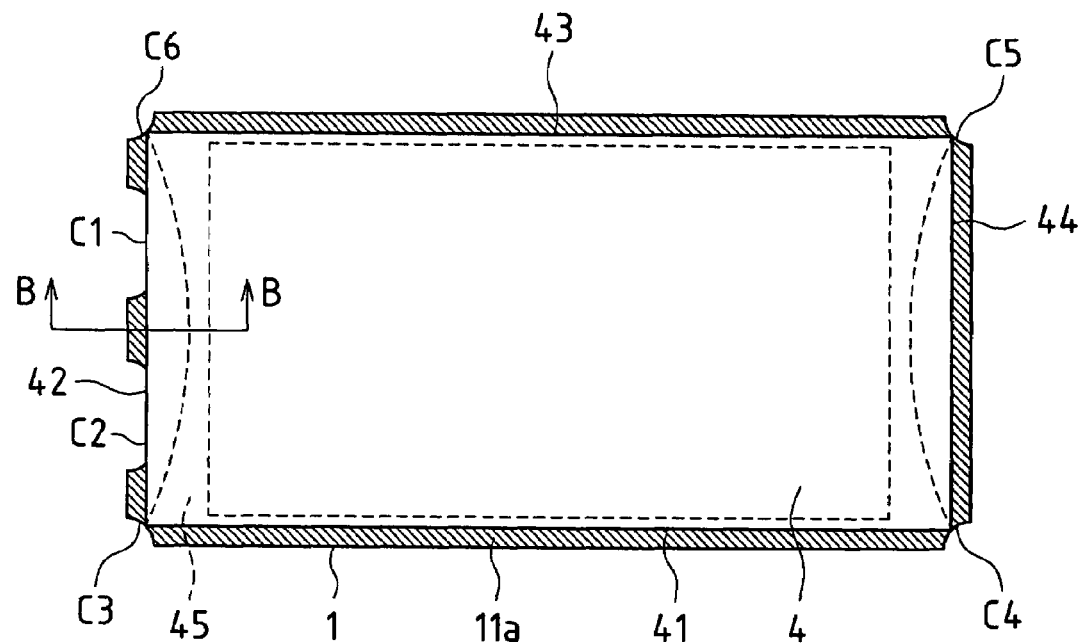
FIG. 9(a) is a plan view illustrating a sixth embodiment.
FIG. 9(b) is a partial cross-sectional view thereof, taken along line B-B of (a).
Figure 9:
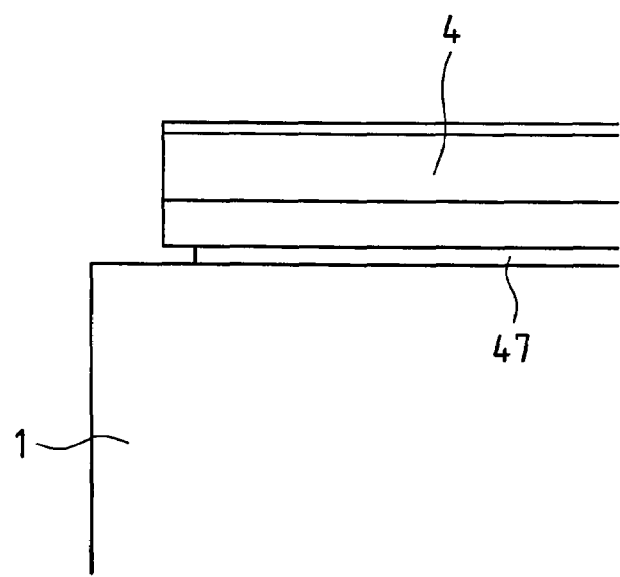

The present invention is not limited to the above-described embodiment. For example, the metal lid 4 may have a structure, such as that illustrated in FIG. 9. FIG. 9 illustrates a plan view illustrating the sixth embodiment of the present invention and a partial cross-sectional view thereof, taken along line B-B. The basic structure is the same as that of the fifth embodiments, and therefore, the same components are indicated with the same reference numerals and a part thereof will not be described.

The metal lid 4 of a crystal oscillator of the sixth embodiment has a flat plate structure having a rectangular shape as viewed from the top, and is composed of a core material (not shown) made of kovar and a metal brazing material as a second metal layer (not shown). More specifically, for example, the metal lid 4 has a multi-layer structure including a nickel layer, a kovar core material, a copper layer, and a silver wax layer in this order from the upper surface. The silver wax layer (second metal layer) is bonded with a first metal layer 11a of a ceramic package 1.

A welding portion 45 of this embodiment is provided along end portions (an outer circumference as viewed from the top) of the metal lid 4. The welding portion 45 is not provided at locations of shorter sides 42 and 44 of the metal lid 4 where the metal lid 4 overlaps end portions of castellations C1 and C2 of the ceramic package 1 when the metal lid 4 is bonded with the ceramic package 1. Specifically, as illustrated in FIG. 9, side end portions of the shorter sides 42 and 44 (end sides) of the metal lid 4 of the welding portion 45 are provided in the shape of an arc toward the inside of the metal lid 4 from the shorter sides 42 and 44 of the metal lid 4.

Also in the sixth embodiment, hermetic sealing is performed using direct seam welding. In this case, since the welding portion 45 is provided along the end portions of the metal lid 4 except for some portions, as described above, the welding portion 45 does not overlap the castellations C1 to C6. Specifically, the metal lid 4 is provided with the welding portion 45 in a manner that, when the metal lid 4 is bonded with the ceramic package 1, the welding portion 45 is located inside the castellations C1 to C6. Therefore, a welding region (a welding region with the first metal layer for touching the metal lid 4 of the ceramic package 1) is avoided from being considerably narrowed. Therefore, leakage is eliminated, thereby making it possible to prevent a failure of hermetic sealing.

Although the above embodiments have been described using a crystal oscillator as an example, the present invention can be applied to other piezoelectric resonator devices (e.g., a crystal vibrator, a crystal filter, etc.) or other electronic-component containers.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority on Patent Application No. 2005-069690 filed in Japan on Mar. 11, 2005, the entire contents of which are hereby incorporated by reference.

INDUSTRIAL APPLICABILITY

The present invention can be applied to an electronic-component container for electronic components which requires hermetic sealing, and particularly, to piezoelectric resonator devices, such as a crystal oscillator, a crystal vibrator, a crystal filter, and the like.

The invention claimed is:
1. An electronic-component container in which a metal lid is bonded with an insulating package, the container comprising:

the insulating package having a housing portion for housing an electronic component element having an electrical function, a metallized sealing portion formed around the housing portion and hermetically bonded with the metal lid, and a castellation having a terminal electrode formed at a side end portion thereof; and the metal lid formed in a shape as viewed from the top which is substantially equal to a shape as viewed from the top of the insulating package, wherein a brazing material is formed on a lower surface of the metal lid, and the brazing material is provided with a welding portion which is bonded with the metallized sealing portion inside the vertical cutout of the castellation when the metal lid is bonded with the insulating package.

2. The electronic-component container according to claim 1, wherein a cut-away portion is provided at a portion of an end portion of the metal lid, the cut-away portion is configured so that, when the metal lid is bonded with the insulating package, the cut-away portion is provided close to the vertical cutout of the inside of the castellation, and the welding portion is provided along the end portion of the metal lid.

3. The electronic-component container according to claim 2, wherein the insulating package further includes a bank portion formed around the housing portion, the housing portion is formed in a rectangular shape as viewed from the top, the metallized sealing portion is formed on an upper surface of the bank portion, the terminal electrode of the castellation is formed at a side end portion of a portion of sides, the cut-away portion of the metal lid is formed in an arc shape at the end portion side so that, when the metal lid is bonded with the insulating package, the cut-away portion is provided close to the inside of the vertical cutout of the castellation, an angle portion as viewed from the top of an end portion of the metal lid is configured so that, when the metal lid is bonded with the insulating package, the angle portion is provided close to an angle portion as viewed from the top of the insulating package, and the welding portion is provided along each side as viewed from the top of the metal lid.

4. The electronic-component container according to claim 1, wherein the brazing material of the metal lid is bonded with the metallized sealing portion of the insulating package by seam welding.

5. The electronic-component container according to claim 1, wherein the cut-away portion of the metal lid is provided, facing end portions facing each other as viewed from the top.

6. The electronic-component container according to claim 1, wherein a bolster portion for supporting housing of an electronic component element to be housed, is provided at the angle portion as viewed from the top of the housing portion.

7. A piezoelectric resonator device, wherein an electronic component element having an electrical function is housed in the housing portion of the electronic-component container according to claim 1, and the electronic component element is a piezoelectric resonator plate which piezoelectric resonates.

* * * * *